United States Patent [19]
Lee et al.

[11] Patent Number: 5,940,714
[45] Date of Patent: Aug. 17, 1999

[54] METHOD OF FABRICATING A CAPACITOR ELECTRODE STRUCTURE IN INTEGRATED CIRCUIT THROUGH SELF-ALIGNED PROCESS

[75] Inventors: Hal Lee, Taipei; Chia-Wen Liang, Hsinchu Hsien, both of Taiwan

[73] Assignee: United Microelectronics Corp., Taiwan

[21] Appl. No.: 09/174,805

[22] Filed: Oct. 19, 1998

[30] Foreign Application Priority Data

Jun. 17, 1998 [TW] Taiwan ................................. 87109657

[51] Int. Cl.⁶ .................................................. H01L 21/20
[52] U.S. Cl. ............................................ 438/396; 438/253
[58] Field of Search ..................................... 257/303, 304, 257/306, 309, 310; 438/239, 240, 253, 254, 255, 256, 260, 396, 397, 398, 399, 964

[56] References Cited

U.S. PATENT DOCUMENTS

| | | | |
|---|---|---|---|
| 5,372,965 | 12/1994 | Ryou | 438/396 |
| 5,721,154 | 2/1998 | Jeng | 438/396 |

*Primary Examiner*—Tuan H. Nguyen
*Assistant Examiner*—Jack Chen
*Attorney, Agent, or Firm*—Thomas, Kayden, Horstemeyer & Risley, L.L.P.

[57] ABSTRACT

A semiconductor fabrication method is provided for fabricating a capacitor electrode structure in an integrated circuit such as a DRAM (dynamic random-access memory) device to serve as a data storage capacitor for the DRAM device. According to this method, a self-aligned process is used to form the bottom electrode of each data storage capacitor of the DRAM device. The first step is to form a first insulating layer over the substrate, which is then selectively removed to form contact windows. Next, a plurality of polysilicon plugs are formed in these contact windows, with the top surfaces thereof being below the top surface of the first insulating layer by a predefined depth. After this, sidewall spacers are formed on the sidewalls of the remaining void portions of the contact windows. After bit lines are formed, another insulating layer is deposited and then selectively removed to form electrode-pattern openings to expose the polysilicon plug that is to be connected to the bottom electrode of the capacitor. Sidewall spacers are then formed on the sidewalls of the electrode-pattern openings. Finally, a conductive layer is formed over the sidewall spacers in each electrode-pattern opening to serve as the bottom electrode of the capacitor.

23 Claims, 6 Drawing Sheets

METHOD OF FABRICATING A CAPACITOR ELECTRODE STRUCTURE IN INTEGRATED CIRCUIT THROUGH SELF-ALIGNED PROCESS

CROSS-REFERENCE TO RELATED APPLICATION

This application claims the priority benefit of Taiwan application serial no. 87109657, filed Jun. 7 1998, the full disclosure of which is incorporated herein by reference.

BACKGROUND OF THE INVENTION

1. Field of the Invention

This invention relates to semiconductor fabrication technology, and more particularly, to a method of fabricating a capacitor electrode structure in an integrated circuit, such as a DRAM (dynamic random-access memory) device, through a self-aligned process.

2. Description of Related Art

In a typical DRAM device, each single memory cell is composed of a transfer field effect transistor (TFET) and a data storage capacitor. Whether each DRAM cell stores a binary value of 1 or 0 is dependent on whether the data storage capacitor therein is fully charged or uncharged. For example, when the capacitor is fully uncharged, it represents the storage of the binary data 0 therein, whereas when fully charged, it represents the storage of the binary data 1 therein.

FIG. 1 is a schematic diagram showing the equivalent circuit structure of one single memory cell of a typical DRAM device. As shown, each DRAM cell includes a TFET T and a data storage capacitor C. The capacitor C is composed of two electrodes 100, and a dielectric layer 101 sandwiched between the two electrodes 100. The TFET T is formed in such a manner that its gate is connected to a word line WL, its source is connected to a bit line BL, and its drain is connected via the capacitor C to the ground. Whether the memory cell stores a binary data bit 0 or 1 is dependent on whether the capacitor C is fully charged or uncharged. Any access to the data stored in the capacitor C whether read or write, is controlled by the TFET T whose ON/OFF state is further controlled by the voltage state on the wordline WL.

Fundamentally, the charge retaining capability of the capacitor C is proportional to its capacitance. In principle, the capacitance can be increased in the following ways: (1) increasing the surface area of the electrodes of the capacitor C; (2) choosing a dielectric material with a large dielectric constant to form the dielectric layer 102; and (3) reducing the thickness of the dielectric layer 102. With the present technology, however, the dielectric material with the maximum dielectric constant has been used, and therefore, the second method is unfeasible until a new dielectric material is developed. The third method is also unfeasible since there is a limit to the thickness of the dielectric layer.

Therefore, only the first method is a feasible way to increase the capacitance of the data storage capacitor in a DRAM cell. Much research effort in the semiconductor industry is directed to the goal of finding new methods that can increase the surface area of one or both electrodes of the data storage capacitor. There are many conventional methods for doing this. However, most of them are quite complex in procedural steps, and therefore are very laborious and cost-ineffective to carry out.

SUMMARY OF THE INVENTION

It is therefore an objective of the present invention to provide a method of forming a capacitor electrode structure in an integrated circuit, which can increase the electrode surface area and thus the capacitance of the capacitor.

It is another objective of the present invention to provide a method of forming a capacitor electrode structure in an integrated circuit, which is less complex in procedural steps than the prior art so that the method is easier and more cost-effective to carry out compared to the prior art.

In accordance with the foregoing and other objectives of the present invention, a method of forming a capacitor electrode structure in an integrated circuit is provided.

According to the method of the invention, a self-aligned process is used to form the bottom electrode of each data storage capacitor of the DRAM device. In the method of the invention, the first step is to form a first insulating layer over the substrate, which is then selectively removed to form contact windows. Next, a plurality of polysilicon plugs are formed in these contact windows, with the top surfaces thereof being below the top surface of the first insulating layer by a predefined depth. After this, sidewall spacers are formed on the sidewalls of the remaining void portions of the contact windows. After bit lines are formed, another insulating layer is deposited and then selectively removed to form electrode-pattern openings to expose the polysilicon plug that is to be connected to the bottom electrode of the capacitor. Sidewall spacers are then formed on the sidewalls of the electrode-pattern openings. Finally, a conductive layer is formed over the sidewall spacers in each electrode-pattern opening to serve as the bottom electrode of the capacitor.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 2A–2K are schematic sectional diagrams used to depict the steps involved in the method of the invention for fabricating a capacitor electrode structure in an integrated circuit such as a DRAM device.

Figure 1:
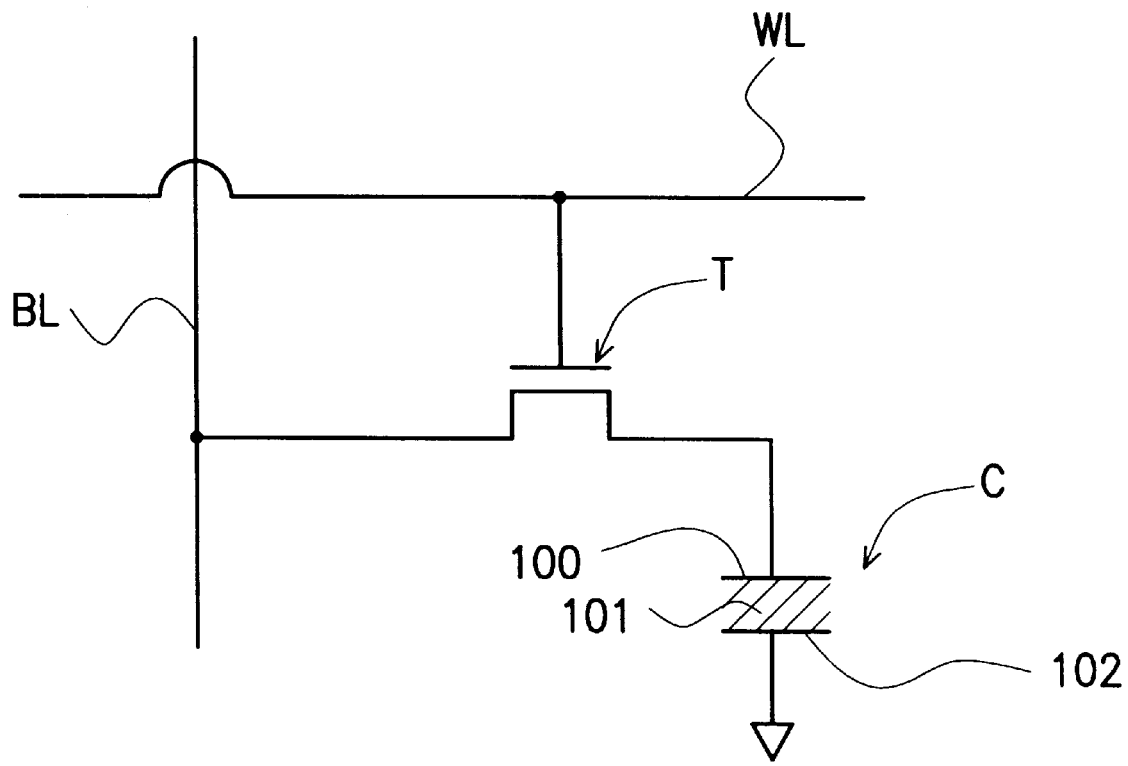
FIG. 1 is a schematic diagram showing the equivalent circuit of one single memory cell in a typical DRAM device.
Figure 2A:
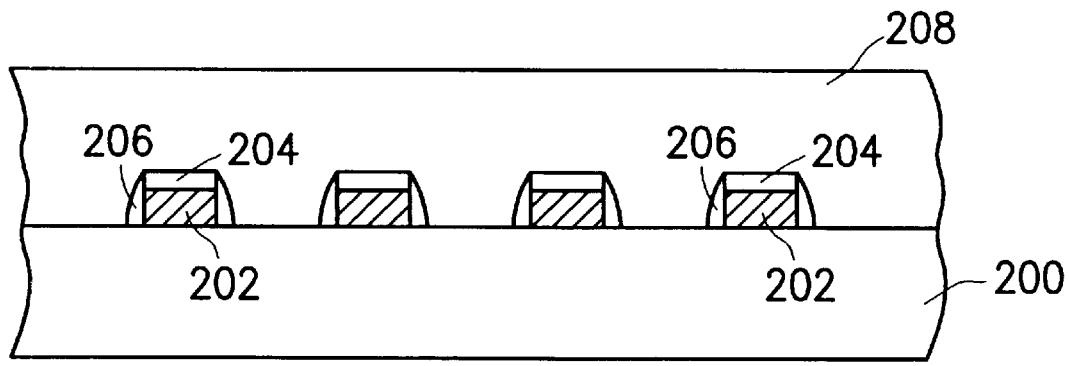
FIGS. 2A–2K are schematic sectional diagrams used to depict the steps involved in the method of the invention for fabricating a capacitor electrode structure in an integrated circuit.

Referring first to FIG. 2A, the DRAM device is constructed on a semiconductor substrate 200. A plurality of first conductive layers 202 is formed over the substrate 200 such that they are parallel to and, equidistant from each other. . These first conductive layers 202 are used to serve as word lines for the DRAM device. Next, a first insulating layer 204 is formed from a dielectric material, such as silicon nitride or silicon-rich oxide (SRO), over each of the first conductive layers 202. Further, a plurality of first sidewall spacers 206 are formed, also from silicon nitride or SRO, on the sidewalls of the stacked structures of the first conductive layers 202 and the first insulating layers 204. After this, a second insulating layer 208 is deposited over the entire top surface of the wafer, covering all the exposed surfaces of all the currently formed components on the substrate 200.

Figure 2B:
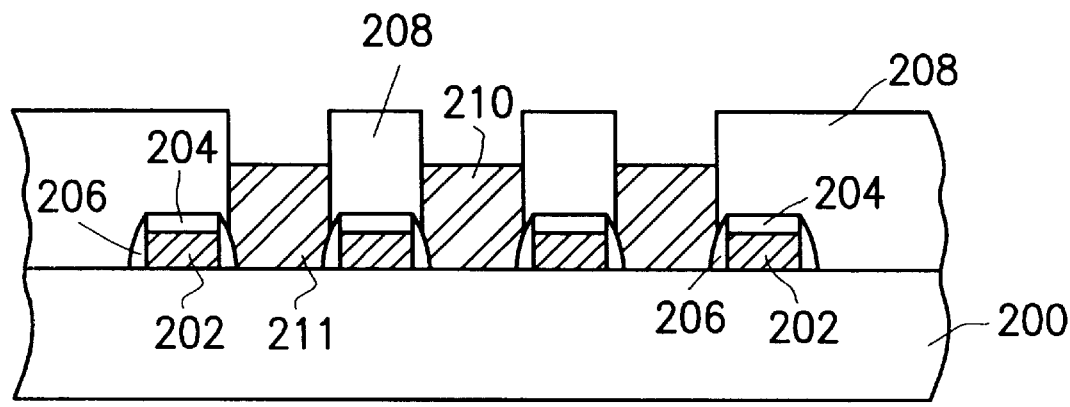

FIG. 2B shows the subsequent step, in which the second insulating layer 208 is selectively removed so as to form contact windows at selected locations to expose those surface areas of the substrate 200 that are located between the first conductive layers 202. Next, the contact windows in the second insulating layer 208 are filled with polysilicon to form a first polysilicon plug 210 and a second polysilicon plug 211 in each neighboring pair of the contact windows, with the top surfaces of the polysilicon plugs 210, 211 being below the top surface of the second insulating layer 208 by a predefined depth of 2,000–4,000 Å.

These polysilicon plugs 210, 211 can be formed by, for example, first depositing a polysilicon layer over the wafer to fill all of the contact windows in the second insulating layer 208 and then performing an etch-back process on the polysilicon layer to a predefined, controlled depth of about 2,000–4,000 Å (i.e., the distance from the topmost surface of the second insulating layer 208 to the topmost surface of the remaining portions of the polysilicon layer). The remaining portions of the polysilicon layer then serve as the above-mentioned polysilicon plugs 210,211.

Figure 2C:
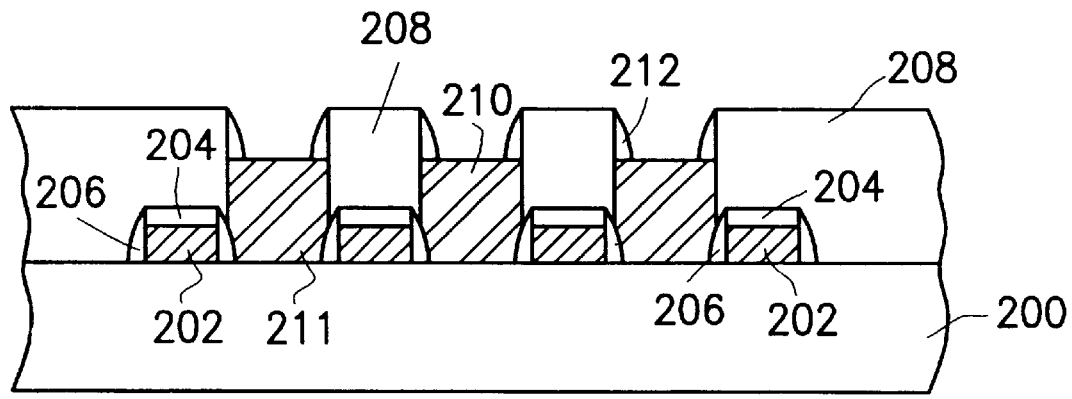

Referring further to FIG. 2C, in the subsequent step, a plurality of second sidewall spacers 212 are formed on the sidewalls of the remaining void portions of the contact windows above the polysilicon plugs 210, 211. These second sidewall spacers 212 can be formed, for example, by first depositing a third insulating layer from oxide or silicon nitride over the entire top surface of the wafer to a thickness of about 500 Å and then performing an etch-back process on the third insulating layer until the top surfaces of the polysilicon plugs 210, 211 are exposed. The remaining portions of the third insulating layer then serve as the second sidewall spacers 212.

Figure 2D:
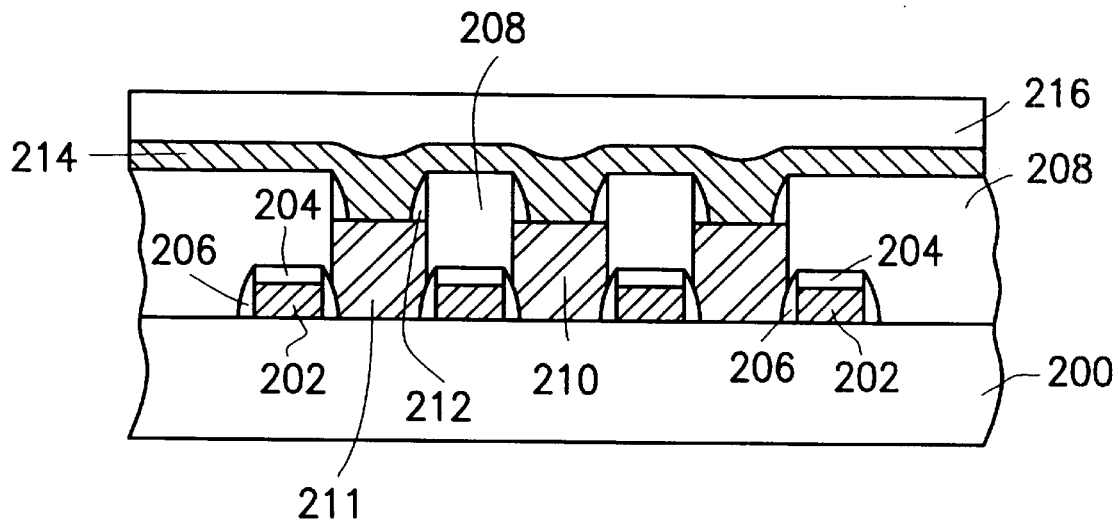

FIG. 2D shows the subsequent step, in which a second conductive layer 214 is formed over the entire top surface of the wafer. This second conductive layer 214 covers all the exposed surfaces of the second insulating layer 208 and fills all of the void portions above the polysilicon plugs 210, 211. Next, a fourth insulating layer 216 is formed from a dielectric material, such as silicon nitride or SRO, over the second conductive layer 214 to a thickness of 1,000–3.000 Å.

Figure 2E:
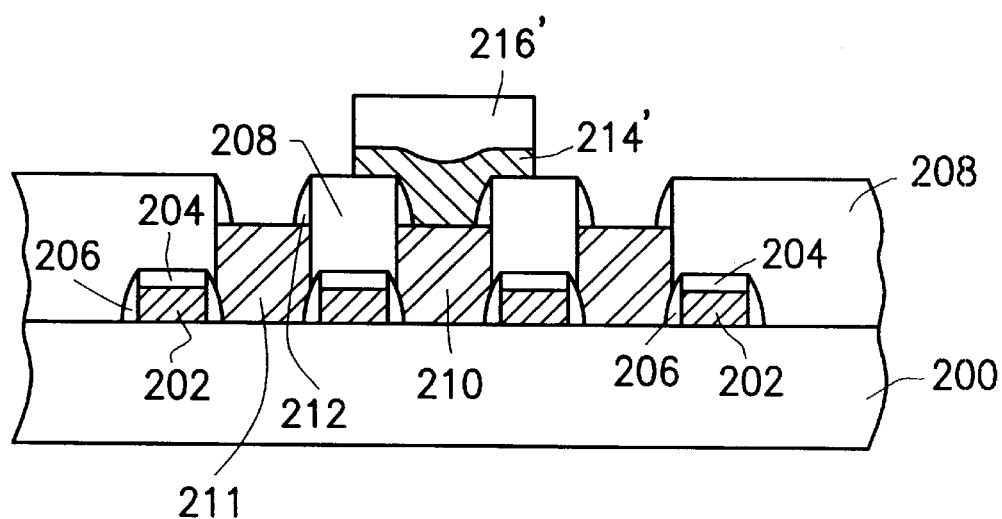

Referring further to FIG. 2E, in the subsequent step, a selective etching process is performed to remove selected portions of the fourth insulating layer 216 and the underlying second conductive layer 214 other than those portions that are to be defined as a bit line located above the first polysilicon plug 210 (the remaining portions thereof are designated here by the reference numerals 214' and 216' for distinguishing purpose). This conductive layer 214' is then used to serve as the bit line, which is covered by the insulating layer 216'.

Figure 2F:
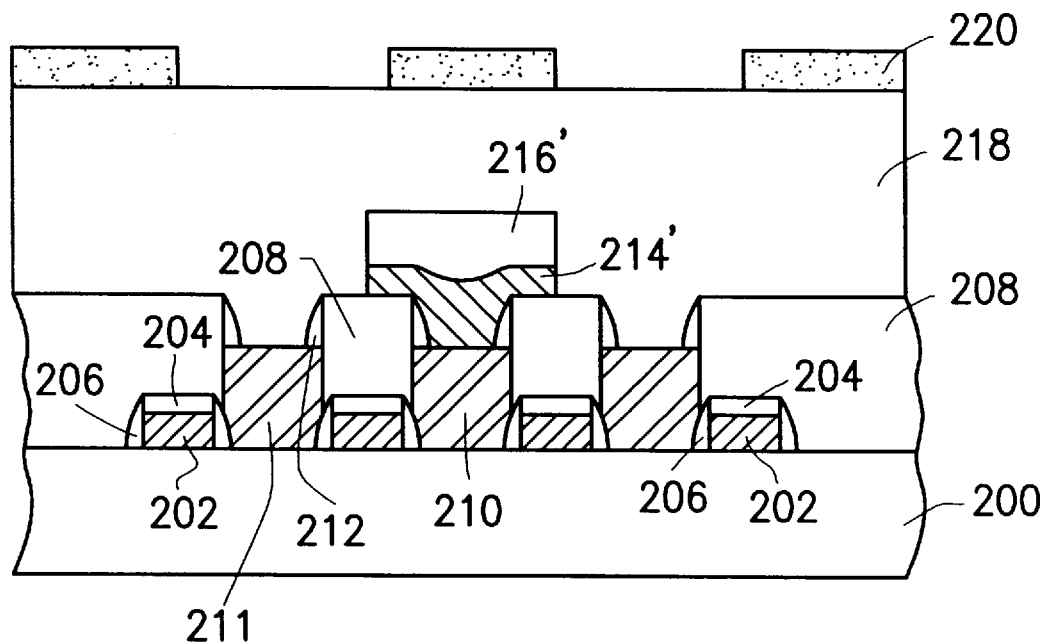

FIG. 2F shows the subsequent step, in which a fifth insulating layer 218 is deposited over the entire top surface of the wafer, covering all of the currently formed components on the substrate 200. Next, a photoresist layer 220 is deposited over the fifth insulating layer 218. The photoresist layer 220 is then selectively removed so as to expose those areas of the fifth insulating layer 218 where the data storage capacitor of the DRAM cell is defined. More specifically, the areas that are unmasked by the photoresist layer 220 lie directly over the second polysilicon plugs 211.

Figure 2G:
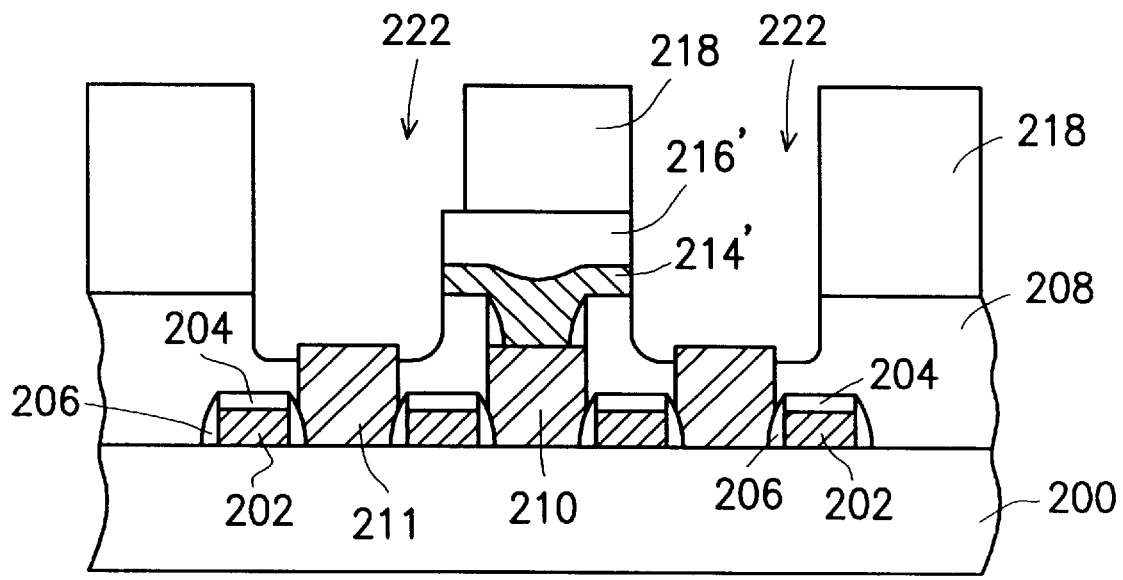

Referring to FIG. 2G, in the subsequent step, in which the photoresist layer 220 serves as a mask for an anisotropic etching process performed on the wafer until the top surface of the second polysilicon plugs 211 are exposed. This anisotropic etching process forms a plurality of electrode-pattern openings 222 which penetrate through the fifth insulating layer 218 and the second insulating layer 208 to expose the second polysilicon plugs 211. Since this etching process is anisotropic, the electrode-pattern openings 222 are self-aligned.

Figure 2H:
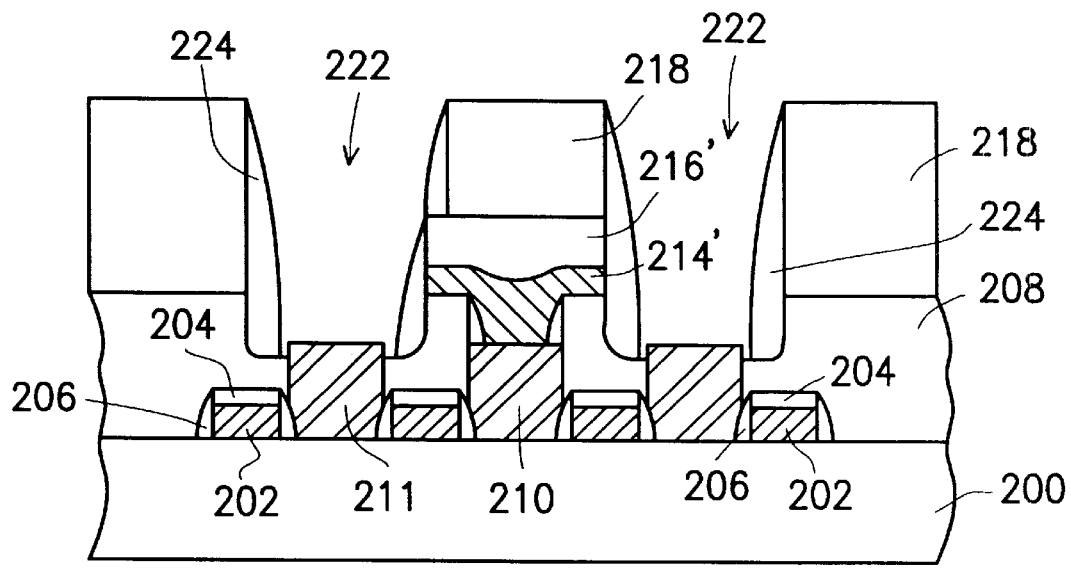

FIG. 2H shows the subsequent step, in which a plurality of third sidewall spacers 224 are formed on the sidewalls of the electrode-pattern openings 222. These third sidewall spacers 224 can be formed by, for example, first depositing a sixth insulating layer from a dielectric material, such as silicon nitride or oxide, over the entire top surface of the wafer of FIG. 2G to a thickness of 500–1,000 Å, and then performing an etch-back process on the sixth insulating layer until the top surfaces of the second polysilicon plug 211 are entirely exposed.

Figure 2I:
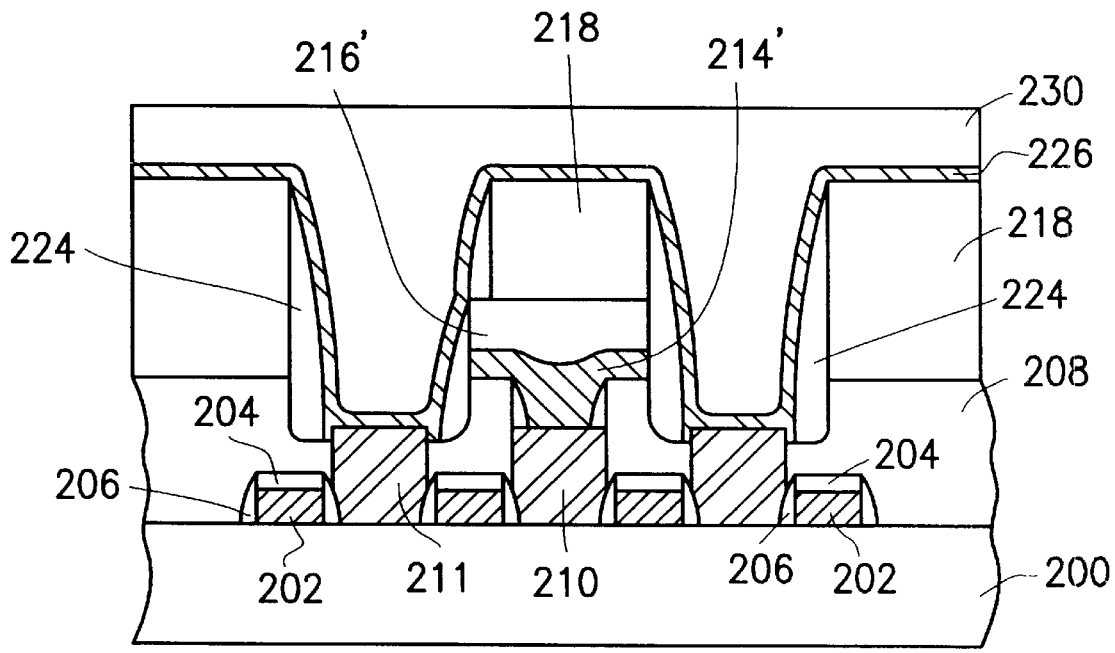

FIG. 2I shows the subsequent step, in which a third conductive layer 226 is deposited over the entire exposed surface of the wafer, covering all the exposed surfaces of the fifth insulating layer 218, the third sidewall spacers 224, and the polysilicon layers 210, but not filling the electrode-pattern openings 222. Next, a seventh insulating layer 230 is deposited over the entire top surface of the wafer, covering the entire third conductive layer 226 and filling all the remaining void portions of the electrode-pattern openings 222.

Figure 2J:
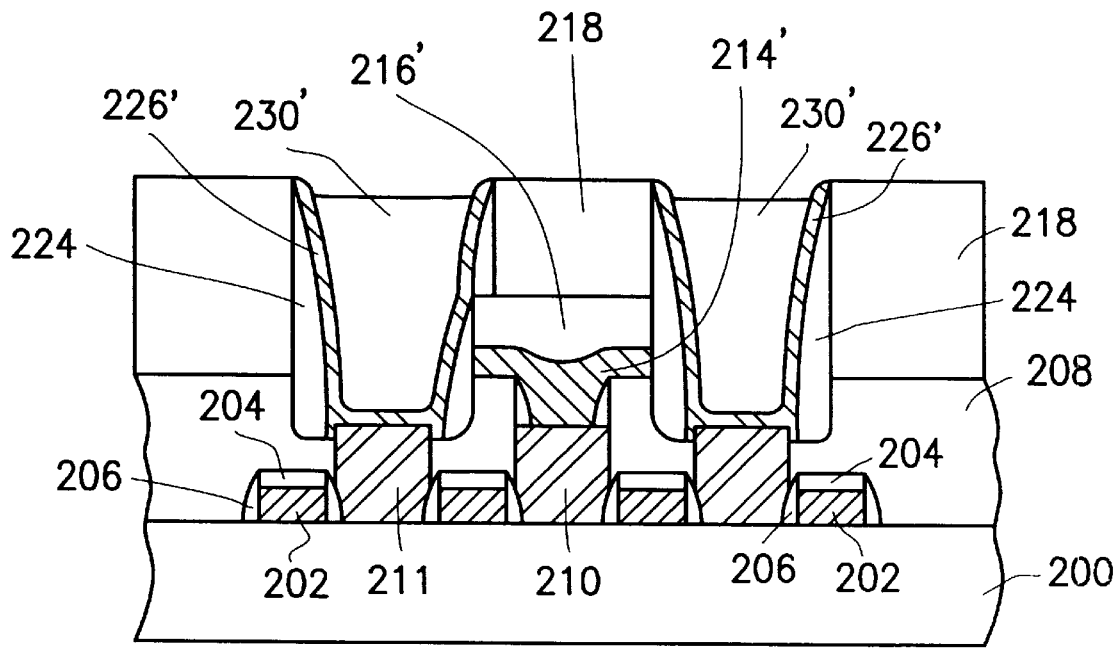

FIG. 2J shows the subsequent step, in which a removal process, such as a CMP (chemical-mechanical polish) process, is performed on the wafer until the topmost surface of the fifth insulating layer 218 is exposed. This removal process removes all the portions of the seventh insulating layer 230 and the third conductive layer 226 that lie above the topmost surface of the fifth insulating layer 218 (the remaining portions of the seventh insulating layer 230 are here designated by the reference numeral 230' and the remaining portions of the third conductive layer 226 are here designated by the reference numeral 226' for distinguishing purposes).

Figure 2K:
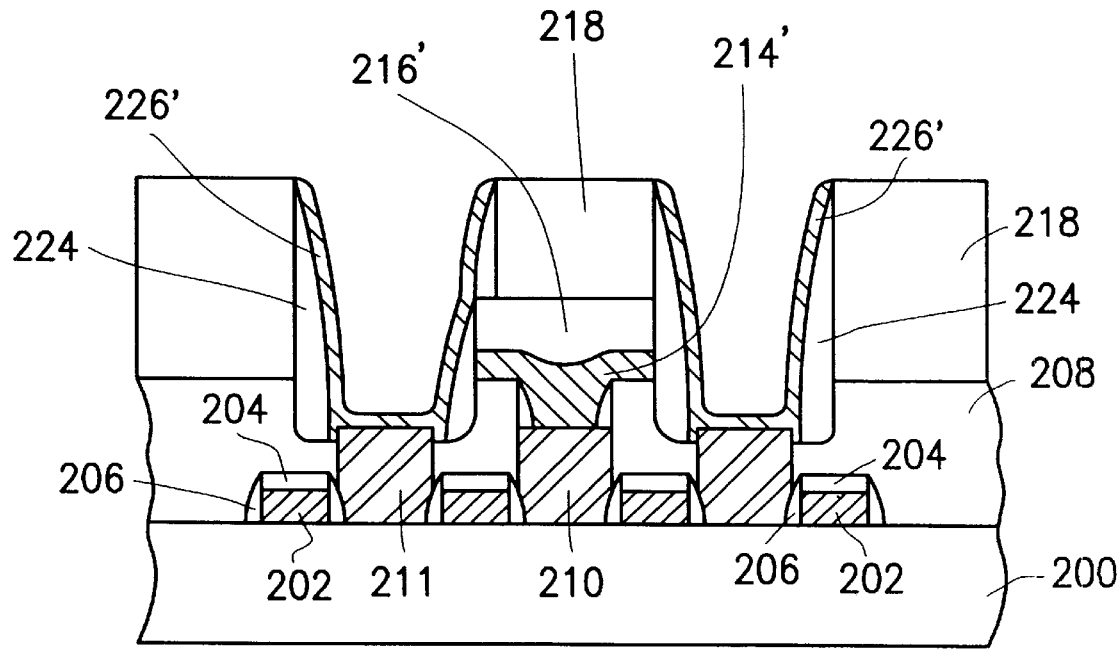

FIG. 2K shows the final step, in which a selective etching process is performed on the wafer so as to remove the remaining insulating layers 230'. Each of the remaining conductive layers 226' then serves as a bottom electrode for the data storage capacitor of the DRAM cell.

In subsequent processes, a dielectric layer and an upper electrode structure are successively formed over the bottom electrode to constitute a complete capacitor. These processes are conventional processes and not within the spirit and scope of the invention, so description thereof will not be further detailed.

In conclusion, the invention provides a method for fabricating a capacitor electrode structure for an integrated circuit, which uses fewer mask processes than the prior art, so that the manufacture of the DRAM device is easier and more cost-effective to carry out.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a capacitor electrode structure in an integrated circuit constructed on a semiconductor substrate, the method comprising the steps of:

forming a first insulating layer having a top surface over the substrate;

removing selected portions of the first insulating layer to form contact windows to expose selected areas of the substrate;

forming a plurality of polysilicon plugs including at least a first polysilicon plug and a second polysilicon plug, each having a top surface, which fill part of the contact windows in the first insulating layer, with the top surfaces thereof being below the top surface of the first insulating layer;

forming a first sidewall spacer on a sidewall of the first insulating layer above each polysilicon plug;

forming a bit line over the first insulating layer, which fills a remaining void portion of the contact window above the first polysilicon plug and which is electrically connected to the first polysilicon plug;

forming a topping insulating layer over the bit line;

forming a second insulating layer to cover all components currently formed on the substrate;

removing selected portions of the second insulating layer and the underlying first insulating layer so as to form electrode-pattern openings that exposes the second polysilicon plug;

forming a third insulating layer and etching back the third insulating layer to form a second sidewall spacer on sidewalls of the electrode-pattern openings; and forming a bottom electrode for the capacitor in each electrode-pattern opening.

2. The method of claim 1, wherein the step of forming the bottom electrode further comprises the substeps of:

forming a conductive layer that covers exposed surfaces of all of the components currently formed on the substrate, wherein the conductive layer does not fill the electrode-pattern openings, and is electrically connected to the second polysilicon plug;

forming a fourth insulating layer over the conductive layer, which fills the electrode-pattern openings, removing all of the portions of the fourth insulating layer and the conductive layer that are laid over the second insulating layer; and removing select portions of the fourth insulating layer, whereby remaining portions of the conductive layer serving as the bottom electrode.

3. The method of claim 2, wherein the step of removing select portions of the fourth insulating layer and the conductive layer is carried out through a CMP process.

4. The method of claim 1, wherein the first sidewall spacers are formed from silicon nitride.

5. The method of claim 1, wherein the first sidewall spacers are formed from oxide.

6. The method of claim 1, wherein the topping insulating layer is formed from SRO.

7. The method of claim 1, wherein the topping insulating layer is formed from silicon nitride.

8. The method of claim 1, wherein the topping insulating layer is formed to a thickness of 1,000–3,000 Å.

9. The method of claim 1, wherein the third insulating layer is formed from silicon nitride.

10. The method of claim 1, wherein the third insulating layer is formed from oxide.

11. The method of claim 1, wherein the third insulating layer is formed to a thickness of 500–1,000 Å.

12. A method of claim 1, wherein the polysilicon plugs are recessed to a depth of 2,000–4,000 Å from the surface of the first insulating layer.

13. A method for forming a capacitor electrode structure in an integrated circuit, the method comprising the steps of:

forming a first insulating layer having a top surface over a substrate;

removing selected portions of the first insulating layer to form contact windows to expose selected areas of the substrate;

forming a plurality of polysilicon plugs including at least a first polysilicon plug and a second polysilicon plug, each having a top surface, which fill part of the contact windows in the first insulating layer, with the top surfaces thereof being below the top surface of the first insulating layer;

forming a first sidewall spacer structure on a sidewall of each contact window in the first insulating layer above each polysilicon plug;

forming a first conductive layer over the first insulating layer and the polysilicon plugs;

forming a second insulating layer over the first conductive layer;

removing selected portions of the first conductive layer and the second insulating layer to respectively form a bit line and a topping layer over the bit line, the bit line being electrically connected to the first polysilicon plug;

forming a third insulating layer to cover all the components currently formed on the substrate;

removing selected portions of the third insulating layer and the underlying first insulating layer so as to form electrode-pattern openings that expose the second polysilicon plug;

forming a second sidewall spacer on the sidewall of each electrode-pattern opening;

forming a second conductive layer to cover exposed surfaces of all components currently formed over the substrate, wherein the second conductive layer does not fill the electrode-pattern openings, and is electrically connected to the second polysilicon plug;

forming a fourth insulating layer over the second conductive layer, which fills each electrode-pattern opening that exposes the second polysilicon plug, removing all the portions of the fourth insulating layer and the second conductive layer that are laid over the third insulating layer; and removing select portions of the fourth insulating layer, whereby remaining portions of the conductive layer then serve as the bottom electrode.

14. The method of claim 13, wherein the step of removing select portions of the fourth insulating layer and the conductive layer is carried out through a CMP process.

15. The method of claim 13, wherein the first sidewall spacers are formed from silicon nitride.

16. The method of claim 13, wherein the first sidewall spacers are formed from oxide.

17. The method of claim 13, wherein the second insulating layer is formed from SRO.

18. The method of claim 13, wherein the second insulating layer is formed from silicon nitride.

19. The method of claim 13, wherein the second insulating layer is formed to a thickness of 1,000–3,000 Å.

20. The method of claim 13, wherein the second sidewall spacers are formed from silicon nitride.

21. The method of claim 13, wherein the second sidewall spacers are formed from oxide.

22. The method of claim 13, wherein the second sidewall spacers are formed to a thickness of 500–1,000 Å.

23. The method of claim 13, wherein the polysilicon plugs are recessed to a depth of 2,000–4,000 Å from the surface of the first insulating layer.

* * * * *